United States Patent
Peterson

(10) Patent No.: US 6,884,645 B2
(45) Date of Patent: Apr. 26, 2005

(54) METHOD FOR PREPARING A DEVICE STRUCTURE HAVING A WAFER STRUCTURE DEPOSITED ON A COMPOSITE SUBSTRATE HAVING A MATCHED COEFFICIENT OF THERMAL EXPANSION

(75) Inventor: Jeffrey M. Peterson, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/418,870

(22) Filed: Apr. 18, 2003

(65) Prior Publication Data

US 2004/0209440 A1 Oct. 21, 2004

(51) Int. Cl.⁷ .............................................. H01L 21/00
(52) U.S. Cl. ........................... 438/22; 438/25; 438/29; 438/763; 250/216; 250/338.4
(58) Field of Search .......................... 438/22–29, 763; 250/216, 338.4

(56) References Cited

U.S. PATENT DOCUMENTS

| | | | | |
|---|---|---|---|---|
| 5,365,088 A | * | 11/1994 | Myrosznyk | 257/186 |
| 5,585,624 A | * | 12/1996 | Asatourian et al. | 250/216 |
| 5,610,389 A | * | 3/1997 | Asatourian | 250/216 |
| 5,696,377 A | * | 12/1997 | Kanzaki | 250/338.4 |
| 5,714,760 A | * | 2/1998 | Asatourian | 250/352 |
| 5,770,889 A | * | 6/1998 | Rostoker et al. | 257/698 |
| 5,846,850 A | * | 12/1998 | Dreiske et al. | 438/67 |
| 5,849,627 A | | 12/1998 | Linn et al. | |
| 6,420,199 B1 | | 7/2002 | Coman et al. | |
| 6,498,113 B1 | | 12/2002 | Solomon et al. | |
| 6,562,127 B1 | * | 5/2003 | Kud et al. | 117/94 |

FOREIGN PATENT DOCUMENTS

| EP | 0795900 | 9/1997 |
|---|---|---|
| JP | 57 153445 | 9/1982 |

* cited by examiner

Primary Examiner—Matthew Smith
Assistant Examiner—Renzo N Rocchegiani
(74) Attorney, Agent, or Firm—William C. Schubert; Karl A. Vick

(57) ABSTRACT

A wafer structure is deposited on a composite substrate structure having at least two substrate layers bonded together. A first substrate layer is made of a first substrate material having a first-substrate-layer material transverse coefficient of thermal expansion, greater than the wafer transverse coefficient of thermal expansion, and a second substrate layer is made of a second substrate material having a second-substrate-layer material transverse coefficient of thermal expansion, measured parallel to the transverse direction, less than the wafer transverse coefficient of thermal expansion. The substrate layers are present in relative proportions such that the substrate transverse coefficient of thermal expansion differs from the wafer transverse coefficient of thermal expansion by not more than about $2 \times 10^{-6}/°F$.

24 Claims, 3 Drawing Sheets

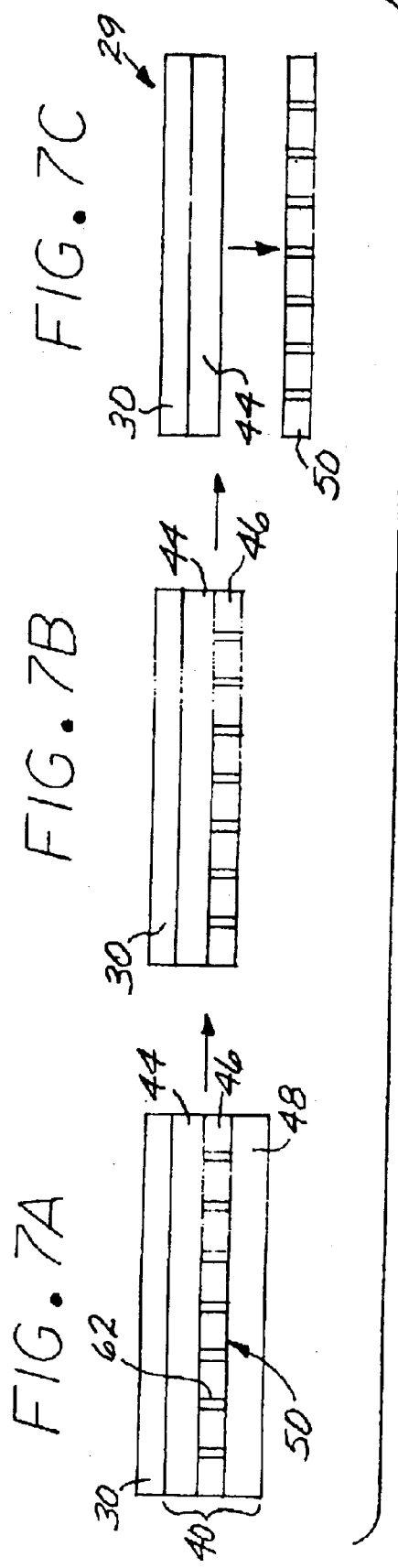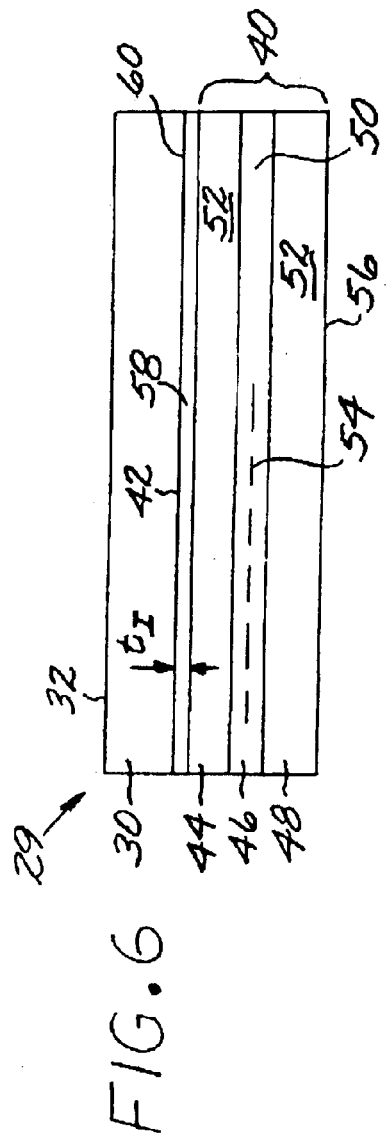

METHOD FOR PREPARING A DEVICE STRUCTURE HAVING A WAFER STRUCTURE DEPOSITED ON A COMPOSITE SUBSTRATE HAVING A MATCHED COEFFICIENT OF THERMAL EXPANSION

This invention relates to the production of a device structure by the deposition of a wafer structure upon a substrate and, more particularly, to the use of a composite substrate having its coefficient of thermal expansion (CTE) matched to that of the deposited wafer structure.

BACKGROUND OF THE INVENTION

One approach to the preparation of thin wafer structures of materials for optical, electronic, and other uses is to deposit the material of the wafer structure onto a substrate. The material is furnished in the liquid phase or the gaseous phase and then transported to the substrate, where it deposits as a solid. The wafer structure gradually builds up its thickness on the substrate in a layer-by-layer manner, so that it is of good purity and high crystal perfection.

The substrate is selected to be compatible with the nature of the wafer structure and with the deposition technique. The substrate must allow the growth of the desired crystal structure of the wafer structure, must be chemically compatible with the wafer structure so that the wafer structure is not contaminated during growth, and must be stable in the conditions of deposition. Additionally, the substrate should not by its thermophysical properties introduce imperfections or damage into the wafer structure as it is deposited, further processed in contact with the substrate, and cooled to room temperature.

In an example, a wafer structure of HgCdTe (mercury-cadmium-telluride) used in an infrared sensor is fabricated by deposition onto a CdZnTe (cadmium-zinc-telluride) substrate using molecular beam epitaxy. However, the physical size of CdZnTe substrates is limited by the available production techniques, so that the lateral area of the HgCdTe wafer structure is limited, under currently available technology, to about 30 square centimeters. It is desired to have larger HgCdTe wafer structures, to allow the production of larger-size focal-plane-array (FPA) infrared detectors.

It has been proposed to use silicon as the substrate to grow larger HgCdTe wafer structures, as large silicon substrates may be readily prepared. However, the HgCdTe wafer structures produced by deposition onto silicon substrates contain high densities of defects that render the HgCdTe wafer structures unusable for many detector applications.

There is accordingly a need for an improved approach to the fabrication of HgCdTe wafer structures, as well as other types of deposited crystals, that is satisfactory for small-area wafer structures, but is also operable for the preparation of wafer structures of larger surface areas. The present invention fulfills this need, and further provides related advantages.

SUMMARY OF THE INVENTION

The present approach provides a technique for preparing a device structure by the deposition of a wafer structure upon a substrate. This approach allows both large-size and small-size wafer structures to be deposited. The resulting wafer structures have a high degree of crystal perfection as well as the required chemical composition.

In accordance with the invention, a method for preparing a device structure, including a wafer structure having a wafer transverse coefficient of thermal expansion (CTE) measured parallel to a transverse direction, comprises preparing a composite substrate structure having a deposition surface and comprising at least two substrate layers bonded together. The composite substrate structure has a substrate transverse coefficient of thermal expansion measured parallel to the transverse direction. The substrate layers comprise at least two different substrate materials including a first substrate layer made of a first substrate material having a first-substrate-layer material transverse coefficient of thermal expansion, measured parallel to the transverse direction, greater than the wafer transverse coefficient of thermal expansion, and a second substrate layer made of a second substrate material having a second-substrate-layer material transverse coefficient of thermal expansion, measured parallel to the transverse direction, less than the wafer transverse coefficient of thermal expansion. The substrate layers are present in relative proportions such that the substrate transverse coefficient of thermal expansion differs from the wafer transverse coefficient of thermal expansion by a small amount, preferably not more than about $2 \times 10^{-6}/°$ F. and most preferably substantially zero. In one embodiment, the substrate transverse coefficient of thermal expansion is slightly greater than the wafer transverse coefficient of thermal expansion. The wafer structure is thereafter deposited, usually at elevated temperature, onto the deposition surface of the composite substrate structure, wherein the transverse direction lies in the deposition surface.

The composite substrate structure may have just two substrate layers. However, in that case there is a tendency for the substrate structure to bow as the temperature is changed. More preferably, the substrate structure has an odd number of substrate layers. Most preferably, the composite substrate structure has exactly three substrate layers, a center layer made of a first one of the substrate materials and two face layers, one on either side of the center layer, each made of the second one of the substrate materials. The materials may be arranged in the composite substrate structure in any desired order. Thus, for example, where the composite substrate is made of two materials A and B, the order of the layers may be A/B/A or B/A/B. The selection of which material is at the substrate surface, and upon which deposition is performed, is typically made according to other considerations such as achieving the desired structure of the deposited wafer structure. It is preferred that the composite substrate structure be physically symmetric, and/or transverse-expansion symmetric about a midplane of the composite substrate structure lying parallel to the deposition surface.

The deposition may be performed by any operable approach. Examples of operable approaches include molecular beam epitaxy, liquid phase epitaxy, and metal-organic chemical vapor deposition.

After deposition, at least a portion of the composite substrate structure may optionally be removed.

In a case of particular interest, the first substrate material is silicon and the second substrate material is sapphire. The preferred three-layer composite substrate structure has the center layer of sapphire, and each of the two face layers of silicon. HgCdTe is deposited onto the composite substrate structure, and specifically onto one of the face layers of silicon.

The composite substrate structure allows the preparation of wafer structures having a surface area of more than about 30 square centimeters.

In one embodiment, an interface layer having an interface-layer surface may be deposited onto the composite substrate structure. The interface-layer surface serves as the deposition surface in subsequent steps. The interface layer, which is preferably quite thin, may be selected to produce optimal lattice matching of the subsequently deposited wafer structure, while simultaneously the substrate structure provides optimal matching of the coefficients of thermal expansion of the wafer structure and the substrate structure.

The present approach arises from the recognition that a primary cause of the defect structure of wafer structures on some substrates, such as a HgCdTe wafer structure on a silicon substrate, is a result of the difference in the coefficients of thermal expansion of the wafer structure and the substrate. When the deposited wafer and substrate are heated and/or cooled after deposition, the difference in the coefficients of thermal expansion causes the relatively thin wafer structure to deform, resulting in dislocations and possibly other defects in the wafer structure.

According to the present approach, the coefficient of thermal expansion of the composite substrate structure is selected to be close to that of the wafer structure that is to be deposited upon it, at least over the temperature range expected in all post-deposition processing involving temperature changes where the wafer structure remains in contact with the composite substrate structure. The transverse coefficient of thermal expansion of the substrate may be controlled by selecting the layers of the composite substrate structure such that some are greater than that of the wafer structure and some are less than that of the wafer structure, and then selecting the relative proportions (i.e., thicknesses) of the various layers to achieve the desired coefficient of thermal expansion for the composite substrate structure. If necessary, the use of the interface layer between the composite substrate structure and the wafer structure, so that the wafer structure is deposited onto the interface layer rather than directly upon the composite substrate structure, allows the desired lattice and crystal-structure matching of the wafer structure. The present approach also allows the thermal expansion of the composite substrate structure to be tailored to intended compositional modifications to the wafer structure.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 6 is an elevational view of a fourth embodiment of the composite substrate structure with the wafer structure deposited thereon; and FIGS. 7A, 7B, and 7C are a schematic block flow diagram of an approach for removing a portion of the substrate structure.

DETAILED DESCRIPTION OF THE INVENTION

Figure 1:
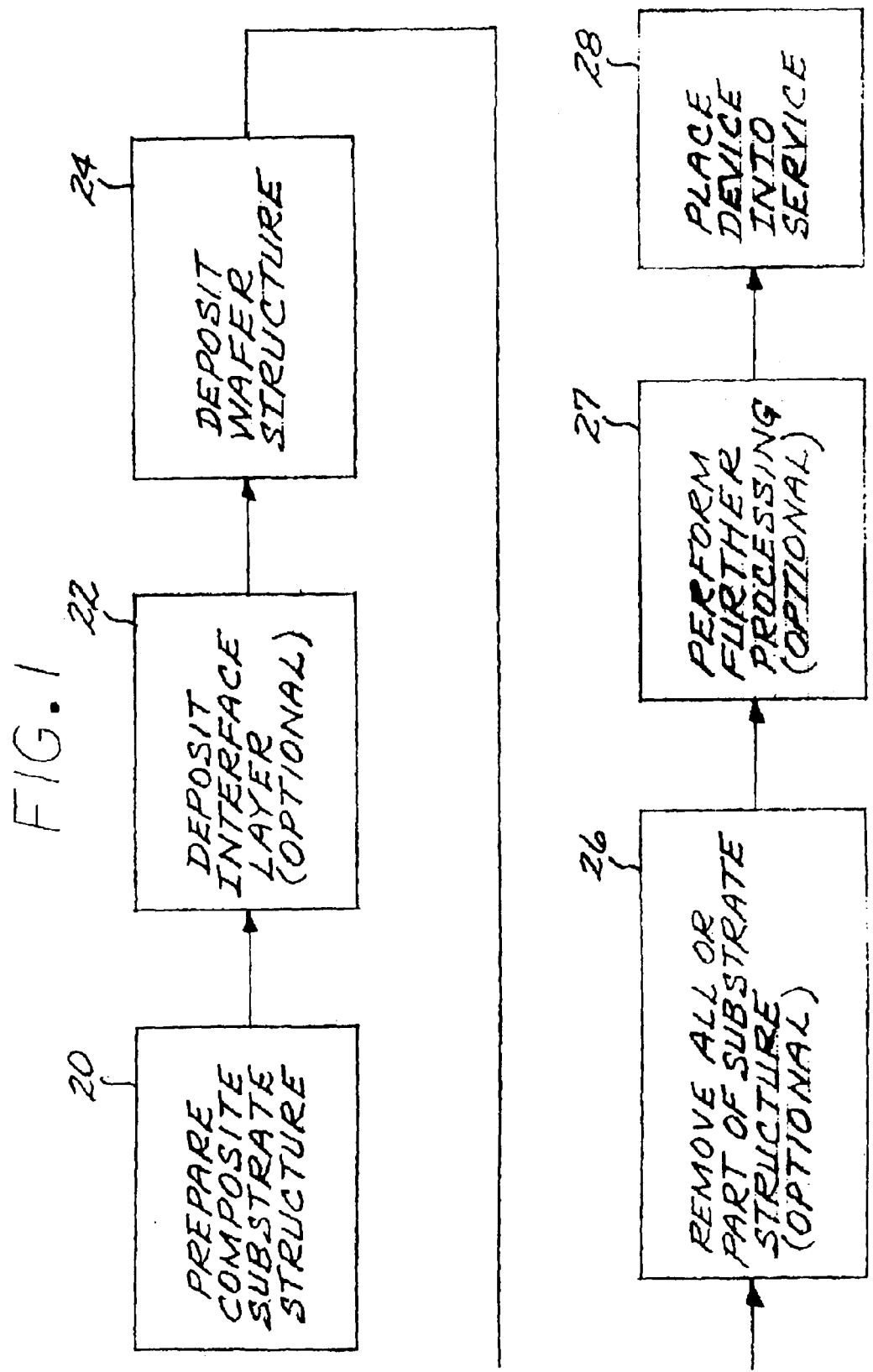
FIG. 1 is a block flow diagram of a preferred approach for practicing the invention.

FIG. 1 depicts a method for practicing the invention, and FIGS. 2–6 depict embodiments that may be produced.

Figure 4:
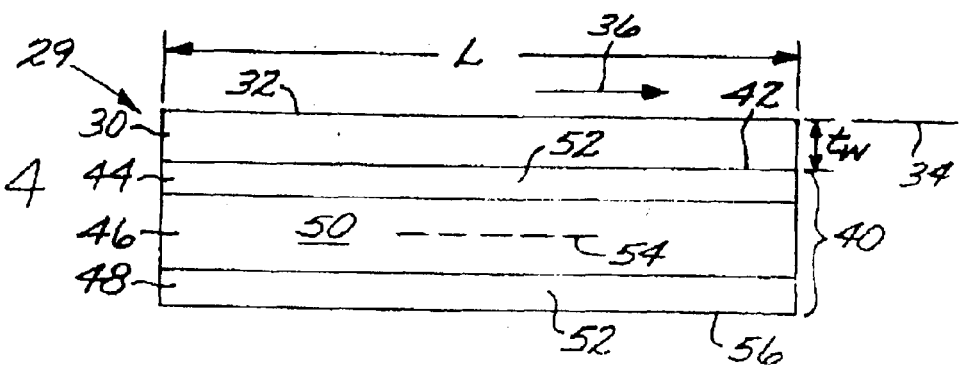
FIG. 4 is an elevational view of the second embodiment of the composite substrate structure with the wafer structure deposited thereon.
Figure 5:
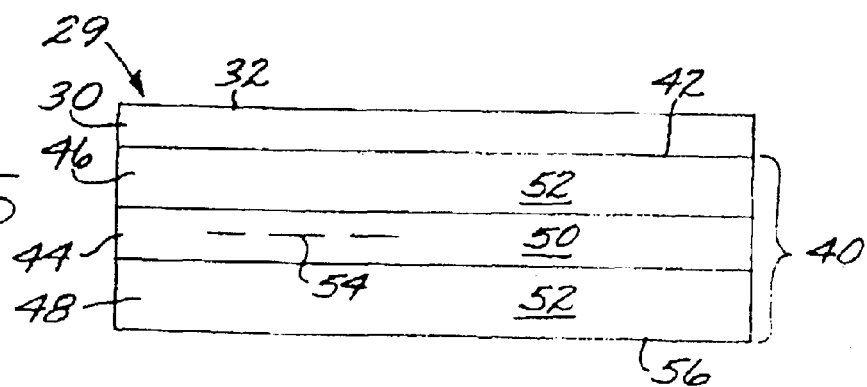
FIG. 5 is an elevational view of a third embodiment of the composite substrate structure with the wafer structure deposited thereon.

The method provides for preparing a device structure 29 including a wafer structure 30, depicted in FIGS. 4–6. The wafer structure 30 typically has a wafer surface 32 that is generally planar and lies in a wafer-surface plane 34 that contains a transverse direction 36. The wafer structure 30 has a transverse dimension L measured parallel to the transverse direction 36 and a thickness $t_W$ that is measured in a direction perpendicular to the wafer-surface plane 34 (FIG. 4). The transverse dimension L is ordinarily, but not necessarily, much greater than the thickness $t_W$. The wafer structure 30 has a wafer transverse coefficient of thermal expansion $CTE_W$ measured parallel to the transverse direction 36. All transverse coefficients of thermal expansion discussed herein are measured parallel to each other and to the transverse direction 36, and all are measured over the same temperature range associated with deposition and post-deposition processing, as long as the wafer structure remains in contact with the composite substrate structure. The measurement range of the coefficients of thermal expansion may also extend to and include the service-temperature range, in those cases wherein the wafer structure remains in contact with the composite substrate structure. In other cases, such as the presently preferred approach, all or a major part of the substrate structure is removed prior to service, and the measurement range does not include the temperatures experienced during service. The wafer structures of FIGS. 5–6 are similar.

Figure 2:
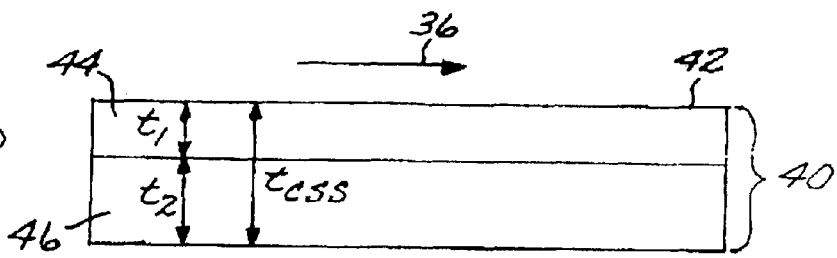
FIG. 2 is an elevational view of a first embodiment of the composite substrate structure.

The method of FIG. 1 includes first preparing a composite substrate structure 40 having a deposition surface 42, step 20. The composite substrate structure 40 comprises at least two substrate layers bonded together. In the embodiment of FIG. 2, there are exactly two substrate layers 44 and 46. In the embodiment of FIGS. 3–6, there are exactly three substrate layers 44, 46, and 48. The layers 44 and 46, or 44, 46, and 48, are either grown to be integral with each other, or are bonded together by any operable approach. It is preferred that there be an odd number of substrate layers, i.e., 3, 5, 7, etc. substrate layers. For reasons of manufacturing convenience, it is most preferred that there are exactly 3 substrate layers. The composite substrate structure 40 has a substrate transverse coefficient of thermal expansion $CTE_{CSS}$ measured parallel to the transverse direction 36. (The layers of FIG. 2 may be reversed, with the layer 46 forming the deposition surface 42. The layers of FIG. 3 may be changed, for example with either of the layers 46 and 48 forming the deposition surface 42.)

Figure 3:
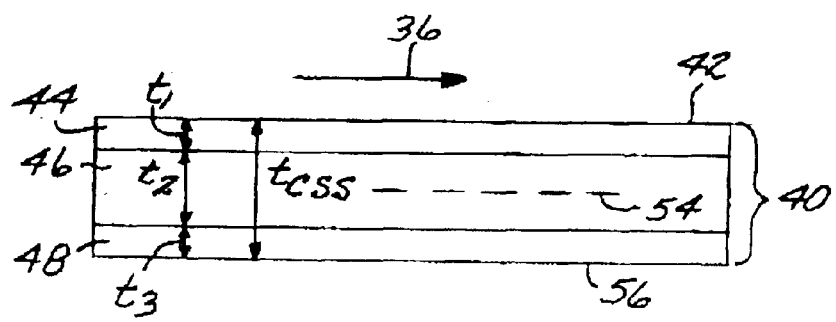
FIG. 3 is an elevational view of a second embodiment of the composite substrate structure.

The substrate layers 44 and 46, or 44, 46, and 48, comprise at least two different substrate materials of construction. The first substrate layer 44 is made of a first substrate material having a first-substrate-layer material transverse coefficient of thermal expansion $CTE_{FSL}$, measured parallel to the transverse direction, greater than the wafer transverse coefficient of thermal expansion $CTE_W$. The second substrate layer 46 is made of a second substrate material having a second-substrate-layer material transverse coefficient of thermal expansion $CTE_{SSL}$, measured parallel to the transverse direction, less than the wafer transverse coefficient of thermal expansion $CTE_W$. Where a third substrate layer 48 is present, it is preferably made of either the first substrate material or the second substrate material, so that its third-substrate-layer transverse coefficient of thermal expansion $CTE_{TSL}$ is the same as $CTE_{FSL}$ or $CTE_{SSL}$. The three substrate layers 44, 46, and 48 have thicknesses respectively of $t_1$, $t_2$, and $t_3$, measured perpendicular to the transverse direction 36. The dimensions are indicated in FIGS. 2 and 3. The total thickness of the composite substrate structure is $t_{CSS} = t_1 + t_2 + t_3$ (if the third substrate layer 48 is present). Thus, the relative thicknesses of the two layers 44 and 46 are represented as $t_1/t_{CSS}$ and $t_2/t_{CSS}$ for the two-layer composite substrate structure 40, and the relative thicknesses of the three layers 44, 46, and 48 are respectively represented as $t_1/t_{CSS}$, $t_2/t_{CSS}$, and $t3/t_{CSS}$ for the three-layer composite substrate structure.

The substrate layers 44 and 46, or 44, 46, and 48, are present in relative proportions such that the substrate transverse coefficient of thermal expansion $CTE_{CSS}$ is substantially the same as, or nearly the same as, the wafer transverse coefficient of thermal expansion $CTE_W$. Preferably, $CTE_{CSS}$ and $CTE_W$ should not differ from each other by more than about $2 \times 10^{-6}/°F$. If they differ by more than this amount, unacceptable defect structures in the wafer structure 30 are likely to result as a result of temperature changes. In most cases, it is preferred that the substrate transverse coefficient of thermal expansion is greater than the wafer transverse coefficient of thermal expansion, so that the wafer structure 30 is in slight compression upon cooling.

The numerical value of $CTE_{CSS}$ may be calculated according to the following relation:

$$CTE_{CSS} = (t_1/t_{CSS} \times CTE_{FSL}) + (t_2/t_{CSS} \times CTE_{SSL})$$

for the case where there are two substrate layers, and as $$CTE_{CSS} = (t_1/t_{CSS} \times CTE_{FSL}) + (t_2/t_{CSS} \times CTE_{SSL}) + (t_3/t_{CSS} \times CTE_{TSL})$$

for the case where there are three substrate layers.

The two-layer composite substrate structure 40 of FIG. 2 may be used. However, when the temperature changes the composite substrate structure 40 of FIG. 2 will tend to bow upwardly or downwardly, depending upon which of $CTE_{FSL}$ and $CTE_{SSL}$ is larger and which is smaller. If a wafer structure is deposited upon this two-layer composite substrate structure 40, it will also be bowed and deformed as the temperature changes, producing defects in the wafer structure. Consequently, this embodiment is not preferred, and will not be discussed further. However, features discussed in relation to the preferred three-layer composite substrate structure 40 of FIGS. 3–6 may be used in relation to the two-layer composite substrate structure 40 of FIG. 2 if desired and to the extent that they are compatible.

The three-layer composite substrate structure 40 of FIGS. 3–6 is preferred, because it may be arranged so that there is no bowing as the temperature changes. In these structures, the composite substrate structure 40 has exactly three substrate layers 44, 46, and 48. The three substrate layers 44, 46, and 48 include a center layer 50 made of a first one of the substrate materials and two face layers 52, one on either side of the center layer 50, each made of a second one of the substrate materials. The two face layers 52 are desirably of the same thickness. In the embodiments of FIGS. 4 and 5, the first substrate layer 44 and the third substrate layer 48 are both made of the first substrate material having the coefficient of thermal expansion $CTE_{FSL}$ (which is, in an example, greater than $CTE_W$), and the second substrate layer 46 is made of the second substrate material having the coefficient of thermal expansion $CTE_{SSL}$ (which is, in an example, less than $CTE_W$). In the embodiment of FIG. 5, the first substrate layer 44 is made of the first substrate material having the coefficient of thermal expansion $CTE_{FLS}$, and the second substrate layer 46 and the third substrate layer 48 are both made of the second substrate material 46 having the coefficient of thermal expansion $CTE_{SSL}$. Thus, the layers may be arranged in an A/B/A arrangement or a B/A/B arrangement, where A and B represent the two different substrate materials.

It is highly desirable that the composite substrate structure 40 be physically symmetric and/or transverse-expansion symmetric about a midplane 54 of the composite substrate structure lying parallel to the deposition surface 42 and midway between the deposition surface 42 and a back surface 56 of the composite substrate structure 40. If the coefficients of thermal expansion of the two face layers 52 are the same and these two face layers are of equal thickness, so that there is physically symmetry about the midplane 54, then there will be no bowing of the composite substrate 40 during temperature changes. If the coefficients of thermal expansion of the two face layers 52 are not the same and the thicknesses of the two face layers 52 are not the same, but the products of the respective relative thicknesses times the respective coefficient of thermal expansion are the same for the two face layers 52, so that there is transverse-expansion symmetry about the midplane 54, then there will be no bowing of the composite substrate structure 40 during temperature changes. Of these possibilities, it is preferred that there be both physical symmetry and transverse-expansion symmetry, a structure that may be manufactured in a straightforward manner.

Optionally, an interface layer 58 (FIG. 6) may be deposited onto the composite substrate structure, step 22. The interface layer 58 has an interface-layer surface 60 that serves as the deposition surface 42 in subsequent steps. The interface layer 58 typically has a thickness $t_1$ that is typically very small as compared with the thickness $t_{CSS}$ of the composite substrate structure 40, and its presence or absence does not substantially affect the calculations of thermal expansion of the composite substrate structure 40 and its layers 44, 46, and 48, as discussed above. In most such calculations, it may therefore be disregarded in the calculations of thermal expansion, because its effects are less than those due to the variations in the relative thicknesses of the layers 44, 46, and 48. However, if the thickness $t_1$ of the interface layer 58 is a substantial fraction of the thickness of the composite substrate structure $t_{CSS}$, then it may be taken into account as a fourth layer in the above-discussed calculations.

The interface layer 58 is provided to ensure epitaxial continuity and lattice matching between the deposition surface 42 and the wafer structure 30. It is selected with this consideration in mind. In a case of interest, where HgCdTe is the wafer material of the wafer structure 30, the center layer 50 is sapphire, and the face layers 52 are silicon, the interface layer is preferably CdZnTe. The same or other interface layer materials may be used for other combinations of composite substrate structure 40 and wafer structure 30.

The wafer structure 30 (which may be a single layer, multiple layers of different compositions, or more complex structures) is deposited, step 24, onto the deposition surface 42 (that is surface of the composite substrate structure 40 if no interface layer 58 is present, or is the surface of the interface layer 58 if it is present). The deposition 24 may be accomplished by any operable technique. A number of types of wafer structures are known in the art in other contexts and may be used here, and the deposition technique is selected to be compatible with the wafer structure. Examples of operable deposition techniques include molecular beam epitaxy, liquid phase epitaxy, and metal-organic chemical vapor deposition, all of which are known in the art for other purposes.

Optionally but preferably, at least a portion of the composite substrate structure 40 may be removed, step 26, after the deposition step 24 is complete. The portion of the substrate structure 40 is removed so that it, and its relative bulk having a different coefficient of thermal expansion than the wafer structure 30, is not present in the event that the finished device structure 29 is cooled to temperatures below room temperature during service. The matching of the coefficients of thermal expansion may therefore be made only over the temperature range in which the device structure 29 is deposited and processed, including deposition and any other treatments required, which are ordinarily performed at and above room temperature. Portions of the substrate that are not needed during service are removed, so that the relatively bulky composite substrate structure 40 is not present to constrain thermal expansion of the wafer structure 30 during its subsequent service. Additionally, in many fabrication techniques, the device structure 29 is subsequently affixed to other structure by techniques such as a bump process, and the unnecessary portions of the composite substrate structure 40 are not needed and in fact interfere with this affixing.

Any operable approach may be used to accomplish the removal step 26, and FIGS. 7A–C depicts one approach. In this technique, the center layer 50, here the second substrate layer 46, is initially provided in step 20 with a series of through-thickness holes 62 therein, FIG. 7A. After the deposition step 24 is complete, the third substrate layer 48 is removed, as for example by mechanical grinding/polishing, wet chemical techniques, and/or dry etching, leaving the structure of FIG. 7B. The center layer 50 is separated from the first substrate layer 44 by immersing the center layer 50 into a solution that dissolves the bond between the first substrate layer 44 and the center layer 50, so that the center layer 50 falls away as a single piece, FIG. 7C. Alternatively, the center layer 50 could be made of a material that readily dissolves in a solvent that does not attack the first substrate layer 44.

Further processing of the device structure 29 is optionally performed as needed, step 27. Such further processing may include, for example, bonding the device structure 29 to other electronic or inert structure using a bump structure or other technique, packaging the device structure 29, and the like. The further processing 27 is specific to the type of wafer structure 30 that is used, and is known in the art for each type of wafer structure 30.

The device structure 29 is thereafter placed into service, step 28. As noted, in many circumstances, the device is placed into service at a temperature below room temperature. In the case of infrared sensors, the devices are typically cooled to a temperature of about 60–85K for service.

An important advantage of the present approach is that wafer structures 30 having larger transverse dimensions L may be made than is otherwise possible. For example, composite substrate structure 40, and thence wafer structures 30, may be made wherein the deposition surface has a surface area of at least about 30 square centimeters. Such large-area wafer structures of some types may not be made by conventional processing due to their thermal-expansion-coefficient incompatibility with the substrate.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing a device structure, including a wafer structure having a wafer transverse coefficient of thermal expansion measured parallel to a transverse direction, comprising the steps of preparing a composite substrate structure having a deposition surface and comprising at least two substrate layers bonded together, wherein the composite substrate structure has an odd number of substrate layers, wherein the composite substrate structure has a substrate transverse coefficient of thermal expansion measured parallel to the transverse direction, wherein the substrate layers comprise at least two different substrate materials including a first substrate layer made of a first substrate material having a first-substrate-layer material transverse coefficient of thermal expansion, measured parallel to the transverse direction, greater than the wafer transverse coefficient of thermal expansion, and a second substrate layer made of a second substrate material having a second substrate-layer material transverse coefficient of thermal expansion, measured parallel to the transverse direction, less than the wafer transverse coefficient of thermal expansion, and wherein the substrate layers are present in relative proportions such that the substrate transverse coefficient of thermal expansion differs from the wafer transverse coefficient of thermal expansion by not more than about $2 \times 10^{-6}/°$ F.; and thereafter depositing the wafer structure onto the deposition surface of the composite substrate structure, wherein the transverse direction lies in the deposition surface.

2. The method of claim 1, wherein the step of preparing includes the step of preparing the composite substrate structure having exactly three substrate layers, wherein the three substrate layers include a center layer made of a first one of the substrate materials and two face layers, one on either side of the center layer, each of the face layers being made of the second one of the substrate materials.

3. The method of claim 1, wherein the step of preparing includes the step of preparing the composite substrate structure with the composite substrate structure physically symmetric about a midplane of the composite substrate structure lying parallel to the deposition surface.

4. The method of claim 1, wherein the step of preparing includes the step of preparing the composite substrate structure with the composite substrate structure transverse-expansion symmetric about a midplane of the composite substrate structure lying parallel to the deposition surface.

5. The method of claim 1, wherein the step of preparing includes the step of preparing the composite substrate structure with the composite substrate structure transverse-expansion symmetric about a midplane of the composite substrate structure lying parallel to the deposition surface.

6. The method of claim 1, wherein the step of preparing includes the step of preparing the composite substrate structure with the substrate transverse coefficient of thermal expansion greater than the wafer transverse coefficient of thermal expansion.

7. The method of claim 1, wherein the step of depositing includes the step of
depositing the wafer structure by molecular beam epitaxy, liquid phase epitaxy, or metal-organic chemical vapor deposition.

8. The method of claim 1, wherein the step of depositing includes the step of depositing the wafer structure at a temperature greater than room temperature.

9. The method of claim 1, including an additional step, after the step of depositing of
further processing the device structure.

10. The method of claim 1, including an additional step, after the step of depositing, of
placing the device structure into service.

11. The method of claim 1, wherein the step of preparing includes the step of
providing the first substrate material as silicon and the second substrate material as sapphire, and wherein the step of depositing includes the step of
depositing a HgCdTe wafer structure onto the deposition surface of the composite substrate structure.

12. The method of claim 1, wherein the step of preparing includes the step of
preparing the composite substrate structure wherein the deposition surface has a surface area of at least about 30 square centimeters.

13. A method for preparing a device structure including a wafer structure having a wafer transverse coefficient of thermal expansion measured parallel to a transverse direction, comprising the steps of
preparing a composite substrate structure having a deposition surface and comprising at least two substrate layers bonded together, wherein the composite substrate structure has a substrate transverse coefficient of thermal expansion measured parallel to the transverse direction, wherein the substrate layers comprise at least two different substrate materials including
a first substrate layer made of a first substrate material having a first-substrate-layer material transverse coefficient of thermal expansion, measured parallel to the transverse direction, greater than the wafer transverse coefficient of thermal expansion, and
wherein the substrate layers are present in relative proportion such that the substrate transverse coefficient of thermal expansion differs from the wafer transverse coefficient of thermal expansion by not more than about $2 \times 10^{-6}/°$ F.; thereafter
depositing the wafer structure onto the deposition surface of the composite substrate structure, wherein the transverse direction lies in the deposition surface, and thereafter
removing at least a portion of the composite substrate structure.

14. The method of claim 13, wherein the step of depositing is performed at a temperature greater than room temperature, and including an additional step, after the step removing, of
placing the device structure into service at a temperature below room temperature.

15. A method for preparing a device structure, including a wafer structure having a wafer transverse coefficient of thermal expansion measured parallel to a transverse direction comprising the steps of
preparing a composite substrate structure having a deposition surface and comprising at least two substrate layers bonded together, wherein the composite substrate structure has a substrate transverse coefficient of thermal expansion measured parallel to the transverse direction, wherein the substrate layers comprise at least two different substrate materials including
a first substrate layer made of a first substrate material having a first-substrate-layer material transverse coefficient of thermal expansion, measured parallel to the transverse direction, greater than the wafer transverse coefficient of thermal expansion, and
a second substrate layer made of a second substrate material having a second-substrate-layer material transverse coefficient of thermal expansion, measured parallel to the transverse direction, less than the wafer transverse coefficient of thermal expansion, and
wherein the substrate layers are present in relative proportions such that the substrate transverse coefficient of thermal expansion differs from the wafer transverse coefficient of thermal expansion by not more than about $2 \times 10^{-6}/°$ F.; thereafter
depositing an interface layer onto the composite substrate structure, the interface layer having an interface-layer surface that serves as the deposition surface in subsequent steps; and thereafter
depositing the wafer structure onto the deposition surface of the composite substrate structure, wherein the transverse direction lies in the deposition surface.

16. A method for preparing a device structure, including a wafer structure having a wafer transverse coefficient of thermal expansion measured parallel to a transverse direction, comprising the steps of
preparing a composite substrate structure having a deposition surface and exactly three substrate layers bonded together, wherein the three substrate layers include a center layer made of a center-layer material and two face layers, one on either side of the center layer, and each made of a face-layer material, wherein
a first one of the center-layer material and the face-layer material has a first-substrate-layer material transverse coefficient of thermal expansion, measured parallel to the transverse direction, greater than the wafer transverse coefficient of thermal expansion, and
a second one of the center-layer material and the face-layer material has a second-substrate-layer material transverse coefficient of thermal expansion, measured parallel to the transverse direction, less than the wafer transverse coefficient of thermal expansion, and
wherein the center layer and the face layers are present in relative proportions such that a substrate transverse coefficient of thermal expansion differs from the wafer transverse coefficient of thermal expansion by not more than about $2 \times 10^{-6}/°$ F.; and thereafter
depositing the wafer structure onto the deposition surface of the composite substrate structure, wherein the transverse direction lies in the deposition surface.

17. The method of claim 16, wherein the step of preparing includes the step of
preparing the composite substrate structure with the composite substrate structure physically symmetric about a midplane of the composite substrate structure lying parallel to the deposition surface.

18. The method of claim 16, wherein the step of preparing includes the step of preparing the composite substrate structure with the composite substrate structure transverse-expansion symmetric about a midplane of the composite substrate structure lying parallel to the deposition surface.

19. The method of claim 16, wherein the step of preparing includes the step of preparing the composite substrate structure with the substrate transverse coefficient of thermal expansion greater than the wafer transverse coefficient of thermal expansion.

20. The method of claim 16, wherein the step of depositing includes the step of depositing the wafer structure by molecular beam epitaxy, liquid phase epitaxy, or metal-organic chemical vapor deposition.

21. The method of claim 16, including an additional step, performed after the step of depositing, of removing at least a portion of the composite substrate structure.

22. The method of claim 16, wherein the step of preparing includes the step of providing the first substrate material as silicon and the second substrate material as sapphire, and wherein the step of depositing includes the step of depositing HgCdTe onto the composite substrate structure.

23. The method of claim 16, wherein the step of preparing includes the step of preparing the composite substrate structure wherein the deposition surface has a surface area of at least about 30 square centimeters.

24. The method of claim 16, wherein the method includes an additional step, after the step of preparing and before the step of depositing the wafer structure, of depositing an interface layer onto the composite substrate structure, the interface layer having an interface-layer surface that serves as the deposition surface in subsequent steps.

* * * * *